(12) United States Patent  
Nozawa et al.

(10) Patent No.: US 7,038,930 B2  
(45) Date of Patent: May 2, 2006

(54) MEMORY DEVICE WITH FUNCTION TO PERFORM OPERATION, AND METHOD OF PERFORMING OPERATION AND STORAGE

(75) Inventors: Hiroshi Nozawa, Uji (JP); Hiroaki Kato, Toyoake (JP); Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 155 days.

(21) Appl. No.: 10/844,069

(22) Filed: May 12, 2004

(65) Prior Publication Data

US 2004/0240251 A1  Dec. 2, 2004

(30) Foreign Application Priority Data

May 27, 2003  (JP) .............................. 2003-148645

(51) Int. Cl.
 *G11C 11/22* (2006.01)

(52) U.S. Cl. .................. 365/145; 365/149; 365/189.05

(58) Field of Classification Search ............ 365/145 O, 365/149, 189.01, 189.05
See application file for complete search history.

(56) References Cited

U.S. PATENT DOCUMENTS

| 5,640,030 | A | * | 6/1997 | Kenney ....................... 257/296 |
| 5,768,182 | A | * | 6/1998 | Hu et al. .................... 365/145 |
| 6,055,176 | A | | 4/2000 | Tamaru et al. |
| 6,166,407 | A | * | 12/2000 | Ohta ........................ 257/298 |

FOREIGN PATENT DOCUMENTS

JP    11-039883    2/1999

* cited by examiner

*Primary Examiner*—VanThu Nguyen  
(74) *Attorney, Agent, or Firm*—Hogan & Hartson, LLP

(57) ABSTRACT

To provide a memory device with a function to perform an operation and a method of performing an operation and storage which can save space and cost and which can start, immediately after the power source is recovered, the processing which was being performed at the time of power failure. A memory cell MC can store two independent data sets; DRAM data (volatile data) and FeRAM data (non-volatile data). Thus, the number of memory cells can be reduced to a half. Also, the DRAM data to be used in the next operation of the two data sets which have been read out for the previous operation are temporarily held in a hold circuit 21 of an operation unit OU and then written back into the memory cell MC in a non-volatile manner as new FeRAM data for preparation of the next operation. Thus, even when the power source is shut down by an unexpected trouble, the data necessary for the next operation are not lost.

20 Claims, 14 Drawing Sheets

MEMORY DEVICE WITH FUNCTION TO PERFORM OPERATION, AND METHOD OF PERFORMING OPERATION AND STORAGE

CROSS-REFERENCE TO RELATED APPLICATION

The entire disclosure of Japanese Patent Application No. 2003-148645 filed on May 27, 2003 including their specification, claims, drawings and summary are incorporated herein by reference in its entirety.

BACKGROUND OF THE INVENTION

1. Field of the Invention

This invention relates to a memory device with a function to perform an operation and a method of performing an operation and storage.

2. Description of Prior Art

A functional memory is known as a device for storing image data or the like. A functional memory has not only a function to store data but also a function to perform a simple operation on the data stored in it. Namely, an operation can be performed in the functional memory and the result of the operation can be written back in its memory cell. A functional memory is advantageous because it can process a large amount of image data without imposing a load on an external main processor.

A functional memory provided with a ferroelectric capacitor is known (see FIG. 1 in JP-A-Hei 11-39883, for example). With a functional memory of this type, the number of transistors and wirings to be used can be reduced. Also, since a large amount of data being processed are not lost even when a trouble occurs in its power source or the like, the processing can be resumed immediately after the power source is recovered.

The conventional functional memory, however, has the following problem. As shown in FIG. 1 of JP-A-Hei 11-39883, a pair of memory cells are necessary to store a pair of data sets to be operated on. Thus, to process a large amount of data such as image data, a large number of memory cells are required. There is therefore a limit of the reduction in the size and production cost of the device.

SUMMARY OF THE INVENTION

The invention has been made to solve the problem of the conventional functional memory. It is, therefore, an object of this invention to provide a memory device with a function to perform an operation, wherein the space and cost of the device are saved and the device is capable of, immediately after the power source is recovered, starting to continue the processing which was being performed at the time of power failure, and also provide a method of realizing such operation as described above.

The memory device with a function to perform an operation according to this invention comprises: a memory section having a memory cell for storing first data in a non-volatile manner and second data in a volatile manner; and an operation and storage control section for making controls to read out the first and second data stored in the memory cell and perform an operation on the first and second data, and to write the read-out second data into the memory cell in a non-volatile manner as new first data.

The method according to this invention, for performing an operation on data and storing data using a memory section having a memory cell for storing first data in a non-volatile manner and second data in a volatile manner, comprises the steps of: reading out first and second data stored in the memory cell and performing an operation on the first and second data; and writing the read-out second data into the memory cell in a non-volatile manner as new first data.

Although the features of this invention can be expressed as above in a broad sense, the constitution and content of this invention, as well as the object and features thereof, will be apparent with reference to the following disclosure, taken in connection with the accompanying drawings.

DESCRIPTION OF THE PREFERRED EMBODIMENT

Figure 1:
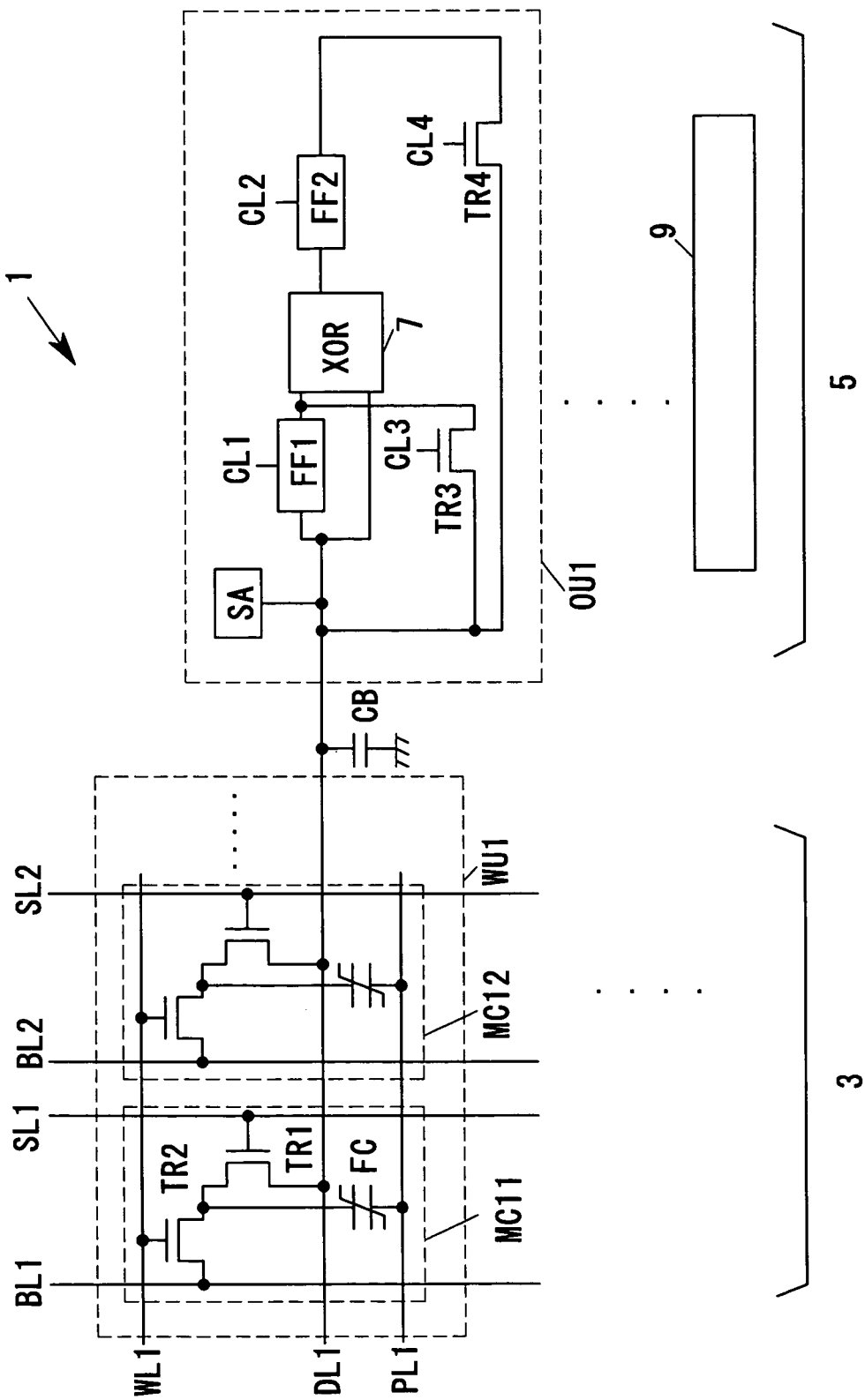
FIG. 1 is a circuit diagram, illustrating a functional memory 1 as a memory device with a function to perform an operation according to an embodiment of this invention.

FIG. 1 is a circuit diagram, illustrating a functional memory 1 as a memory device with a function to perform an operation according to an embodiment of this invention. The functional memory 1 has a memory section 3 and an operation and storage control section 5. The functional memory 1 can be used in an application of detecting a difference between two consecutive image data sets to process image data, for example, to compress video images.

The memory section 3 has a plurality of word units WU1, WU2, . . . (WU2, . . . are not shown). Each of the word units WU1, WU2, . . . has a plurality of memory cells each corresponding to one word. For example, the word unit WU1 has memory cells MC11, MC12, . . .

As described above, a number of memory cells MC11, . . . are arranged in a matrix in the memory section 3. In this embodiment, a plurality of memory cells MC11, MC12, . . . constituting a word unit such as the word unit WU1 constitute one of rows of the memory cells arranged in a matrix.

The functional memory 1 has word lines WL1, WL2, . . . (WL2, . . . are not shown), data lines DL1, DL2, . . . (DL2, . . . are not shown), and plate lines PL1, PL2, . . . (PL2, . . . are not shown) as signal lines for connecting a plurality of memory cells in the same row.

The functional memory 1 has bit lines BL1, BL2, . . . , and select lines SL1, SL2, . . . as signal lines for connecting a plurality of memory cells in the same column.

The memory cell MC11 has one ferroelectric capacitor FC and transistors TR1 and TR2 as first and second switch means, respectively. In this embodiment, the ferroelectric capacitor FC has a coercive voltage Vc higher than a half of the source voltage VDD and lower than the source voltage VDD.

The maximum absolute value of the voltage (maximum absolute voltage) applied to the ferroelectric capacitor FC in reading and writing non-volatile data as first data is set to be equal to the source voltage VDD and the maximum absolute value of the voltage (maximum absolute voltage) applied to the ferroelectric capacitor FC in reading and writing volatile data as second data is set to be a half of the source voltage VDD.

In this case, writing non-volatile data can cause a polarization reversal of the ferroelectric capacitor FC whereas writing or reading volatile data does not cause a polarization reversal of the ferroelectric capacitor FC. Thus, non-volatile data cannot be destroyed.

The coercive voltage Vc of the ferroelectric capacitor FC, the maximum absolute voltage applied to the ferroelectric capacitor FC in reading and writing non-volatile data, and the maximum absolute voltage applied to the ferroelectric capacitor FC in reading and writing volatile data are not specifically limited as long as writing non-volatile data can cause a polarization reversal of the ferroelectric capacitor FC and writing or reading volatile data does not cause a polarization reversal of the ferroelectric capacitor FC.

As shown in FIG. 1, one end of the ferroelectric capacitor FC is connected to the plate line PL1 and the other end is connected to the data line DL1 via the transistor TR1. The transistor TR1 has a gate terminal connected to the select line SL1. The other end of the ferroelectric capacitor FC is also connected to the bit line BL1 via the transistor TR2. The transistor TR2 has a gate terminal connected to the word line WL1.

Transmission and reception of data between the outside of the functional memory 1 and the memory cell MC11 is performed through the bit line BL1 using a row selecting signal given to the word line WL1 as a control signal. Transmission and reception of data between the memory cell MC11 and an operation unit OU1, hereinafter described, is performed through the data line DL1 using a column selecting signal given to the select line SL1 as a control signal. A reference signal for reading data from the memory cell MC11 or writing data into the memory cell MC11 is given to the plate line PL1.

Other memory cells MC12, . . . are constituted in the same manner as the memory cell MC11.

The operation and storage control section 5 has a control unit 9 and a plurality of operation units OU1, OU2, . . . (OU2, . . . are not shown).

The operation units OU1, OU2, . . . correspond to the word units WU1, WU2, . . . , respectively, of the memory section 3. Namely, the operation units OU1, OU2, . . . are connected to the word units WU1, WU2, . . . , respectively, of the memory section 3 via the data lines DL1, DL2, . . . , respectively. The parasitic capacity of the data lines DL1, . . . is used as a load capacity (load capacitor) CB.

The operation unit OU1 has a sense amplifier SA as a normalization circuit, an exclusive OR circuit 7 as an operation circuit, flip-flop circuits FF1 and FF2 as first and second hold circuits, and transistors TR3 and TR4 as third and fourth switch means, respectively.

The sense amplifier SA is connected to the data line DL1 and normalizes a signal on the data line DL1. Namely, the sense amplifier SA judges whether the signal voltage on the data line DL1 is higher or lower than a specified threshold value and forcibly changes the voltage of the data line DL1 to the source voltage VDD or the ground voltage GND depending on the magnitude of the signal.

The flip-flop circuit FF1 holds volatile data as binary data read out from a memory cell of the word unit WU1 such as the memory cell MC11 via the data line DL1 according to the control of a clock line CL1.

The exclusive OR circuit 7 obtains and outputs the excusive OR of the volatile data held in the flip-flop circuit FF1 and non-volatile data as binary data read out from the memory cell MC11.

The flip-flop circuit FF2 holds the result of the operation with the exclusive OR circuit 7 according to the control of a clock line CL2.

The transistor TR3 transmits the volatile data held in the flip-flop circuit FF1 to the data line DL1 according to the control of a clock line CL3. As described later, the volatile data are written into the memory cell MC11 as new non-volatile data.

The transistor TR4 transmits the operation result, held in the flip-flop circuit FF2, to the data line DL1 according to the control of a clock line CL4. As described later, the result of the operation is written into the memory cell MC11 as new volatile data.

The other operation units OU2, . . . are constituted in the same manner as the operation unit OU1.

The control unit 9 controls reading and writing data from and into the memory section 3, the operations in the operation units OU1, . . . , and so on. More specifically, the control unit 9 controls the control lines such as the word lines WL1, . . . , the plate lines PL1, . . . , the data lines DL1, DL2, . . . , the bit lines BL1, BL2, . . . , the select lines SL1, . . . , the control line of the sense amplifier SA, and the clock lines CL1, CL2, CL3 and CL4.

Figure 2:
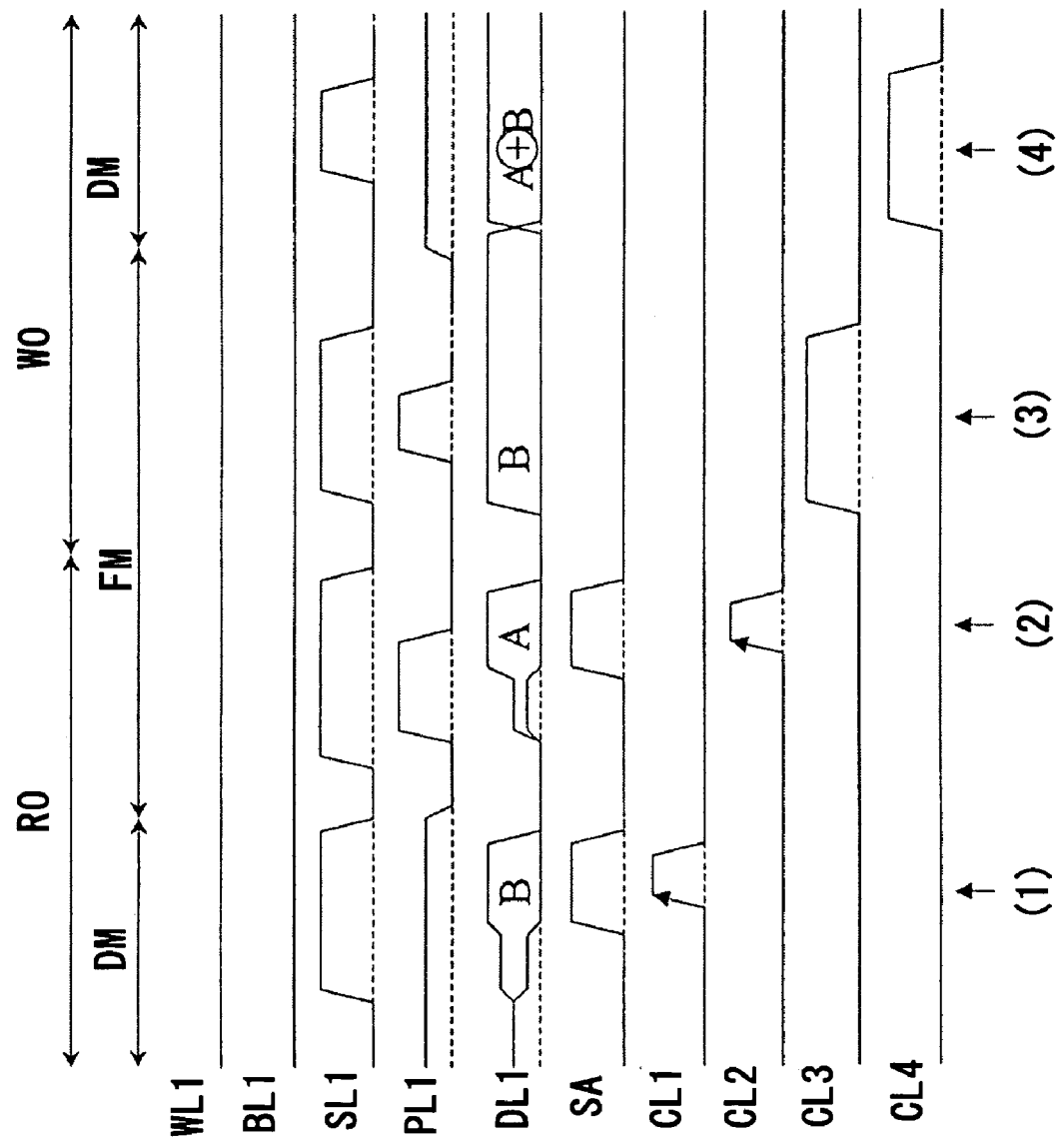
FIG. 2 is an example of a timing diagram, illustrating the operation of the functional memory 1.

FIG. 2 is an example of a timing diagram, illustrating the operation of the functional memory 1 which is performed under the control of the control unit 9. FIG. 3 to FIG. 6 are circuit diagrams used to explain the operation of the functional memory 1. FIG. 7 to FIG. 10 are views for used in explaining the polarization state of the ferroelectric capacitor FC during the operation of the functional memory 1. The operation of the functional memory 1 will be described with reference to FIG. 2 FIG. 10.

In the functional memory 1, a data reading operation RO and a data writing operation WO are alternatively performed as shown in FIG. 2. In the data reading operation RO, data are read out in a volatile mode DM and then in a non-volatile mode FM.

In some cases, the volatile mode DM and the non-volatile mode FM are referred to as DRAM mode and FeRAM mode respectively, and volatile data and non-volatile data are referred to as DRAM data and FeRAM data, respectively.

In the writing operation WO, data are written in a non-volatile mode FM and then in a volatile mode DM.

Figure 3:
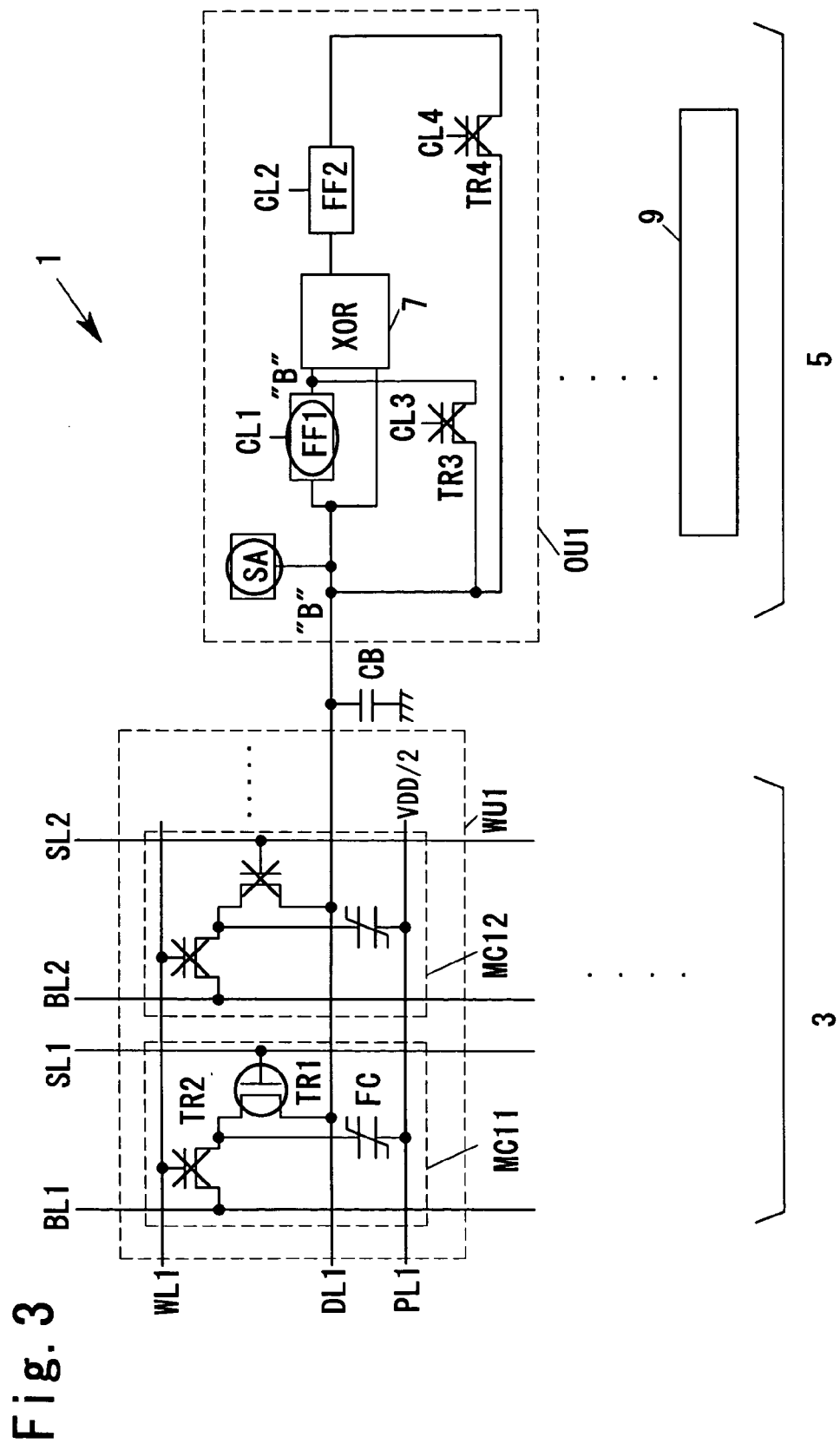
FIG. 3 is a circuit diagram used to explain the operation of the functional memory 1.
Figure 7:
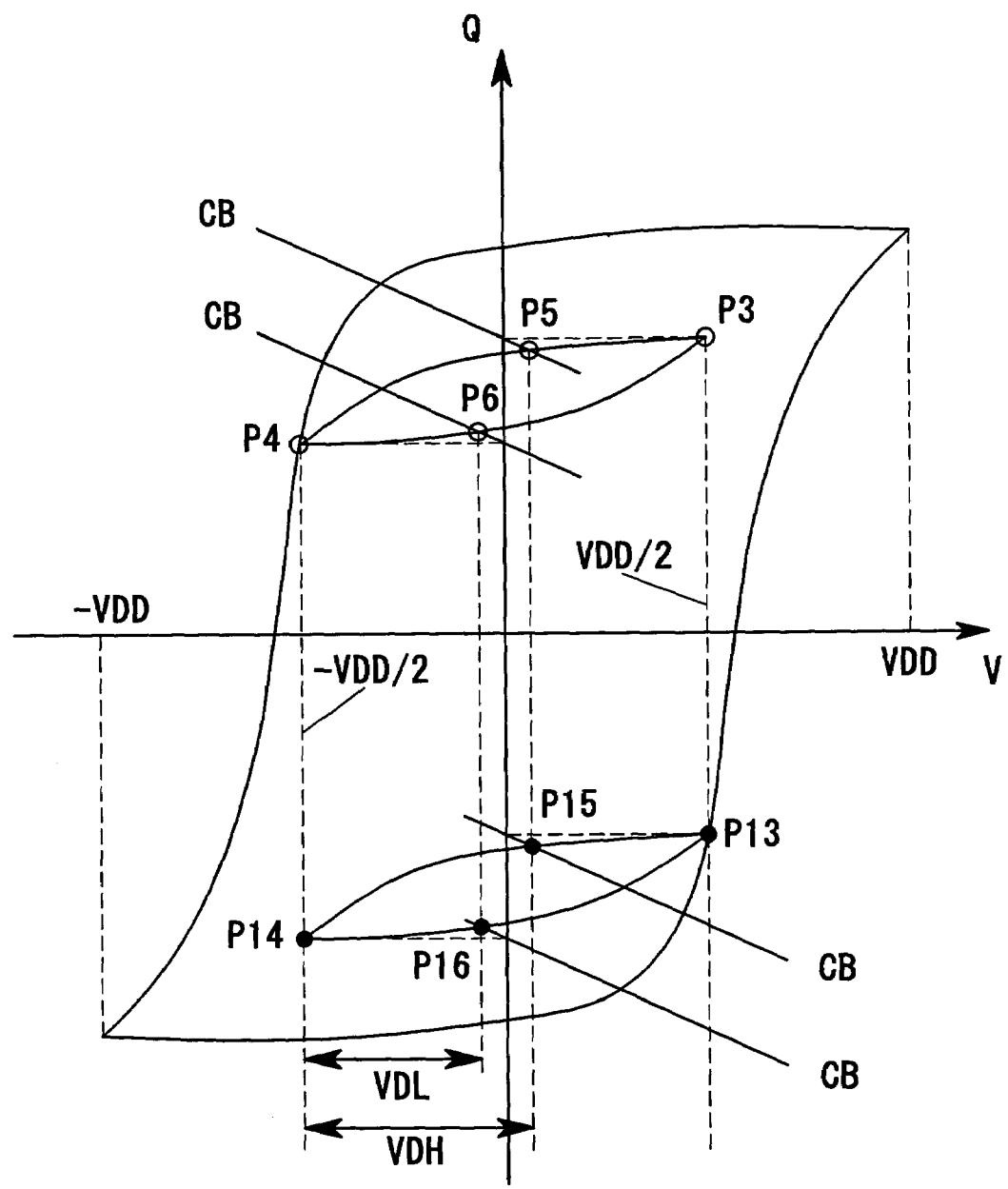
FIG. 7 is a graph used to explain the polarization state of a ferroelectric capacitor FC during the operation of the functional memory 1.

Description will be made of the data reading operation in the volatile mode DM with reference to FIG. 2, FIG. 3 and FIG. 7. FIG. 7 is a graph used to explain the polarization state of the ferroelectric capacitor FC in this operation. FIG. 3 is a view, illustrating the state of the circuit of the functional memory 1 at the moment denoted as (1) in FIG. 2 during the operation.

As shown in FIG. 2 and FIG. 3, in the volatile mode DM, the voltage of the plate line PL1 is maintained at half of the source voltage VDD, namely VDD/2. Here, VDD/2 is given to the data line DL1 and then an ON signal (source voltage VDD) is given to the select line SL1. Then, an ON signal (source voltage VDD) is given to a control terminal of the sense amplifier SA.

By the above sequential procedure, the voltage of the data line DL1 becomes either the source voltage VDD (5 volts, for example) or the ground voltage GND (zero volt). This represents volatile data read out. The volatile data are represented as "B" ("H" or "L"). The "H" and "L" correspond to the source voltage VDD and the ground voltage GND, respectively.

Then, an ON signal (source voltage VDD) is given to the clock line CL1. The volatile data "B" having been read into the data line DL1 are thereby held in the flip-flop circuit FF1.

As shown in FIG. 7, the polarization state of the ferroelectric capacitor FC is one of P3, P4, P13 and P14 immediately after the previous data writing operation in the volatile mode DM (which will be described later).

When the non-volatile data and the volatile data stored in the ferroelectric capacitor FC are represented as "A" ("H" or "L") and "B" ("H" or "L"), respectively, the polarization states P3, P4, P13 and P14 represent (A, B)=(H, H), (A, B)=(H, L), (A, B)=(L, H) and (A, B)=(L, L), respectively. Namely, the ferroelectric capacitor FC has stored either (H, H), (H, L), (L, H) or (L, L) as data (A, B).

For example, when the ferroelectric capacitor FC has stored data (A, B)=(H, H), its polarization state is shifted to P3 via P5 shown in FIG. 7 by this data reading operation in the volatile mode DM.

Similarly, when the ferroelectric capacitor FC has stored data (A, B)=(H, L), its polarization state is shifted to P4 via P6 by this data reading operation. When the ferroelectric capacitor FC has stored data (A, B)=(L, H), its polarization state is shifted to P13 via P15 by this data reading operation. When the ferroelectric capacitor FC stores data (A, B)=(L, L), its polarization state is shifted to P14 via P16 by this data reading operation.

In FIG. 7, VDH represents the voltage which the data line DL1 exhibits immediately before the sense amplifier SA in FIG. 2 is turned on when the volatile data "B" having been stored in the ferroelectric capacitor FC are "H", and VDL represents the voltage which the data line DL1 exhibits immediately before the sense amplifier SA is turned on when the volatile data "B" having been stored in the ferroelectric capacitor FC are "L".

After that, when the sense amplifier SA is turned on, the voltage of the data line DL1 becomes either the source voltage VDD or the ground voltage GND by an action of the sense amplifier SA depending on whether the latest voltage was VDH or VDL. At this time, since the voltage of the plate line PL1 is VDD/2, the voltage applied to the ferroelectric capacitor FC is either +VDD/2 or −VDD/2.

Thus, as can be understood from FIG. 7, the non-volatile data "A" having been written in the ferroelectric capacitor FC are not destroyed by this data reading operation in the volatile mode DM.

Figure 4:
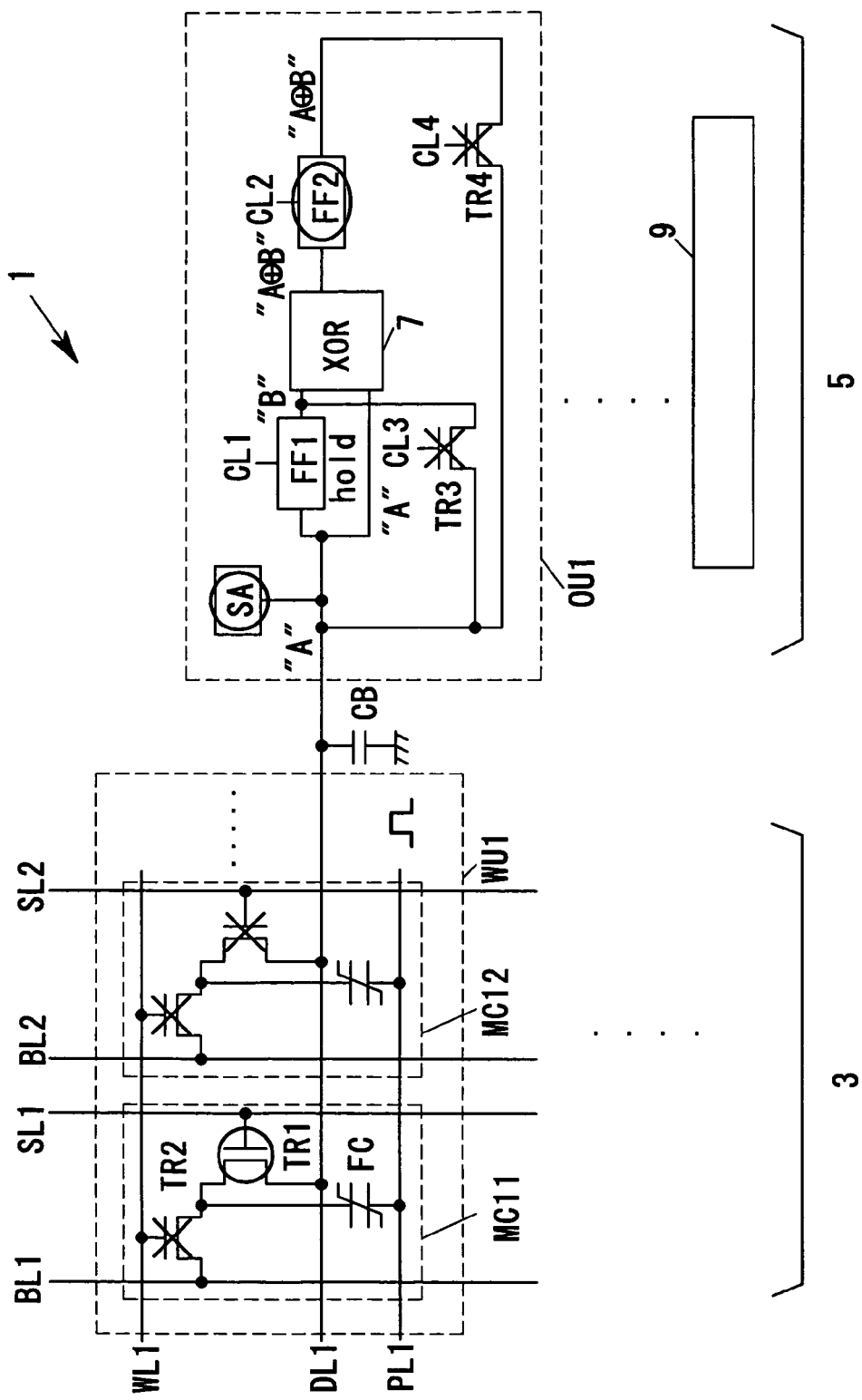
FIG. 4 is a circuit diagram used to explain the operation of the functional memory 1.
Figure 8:
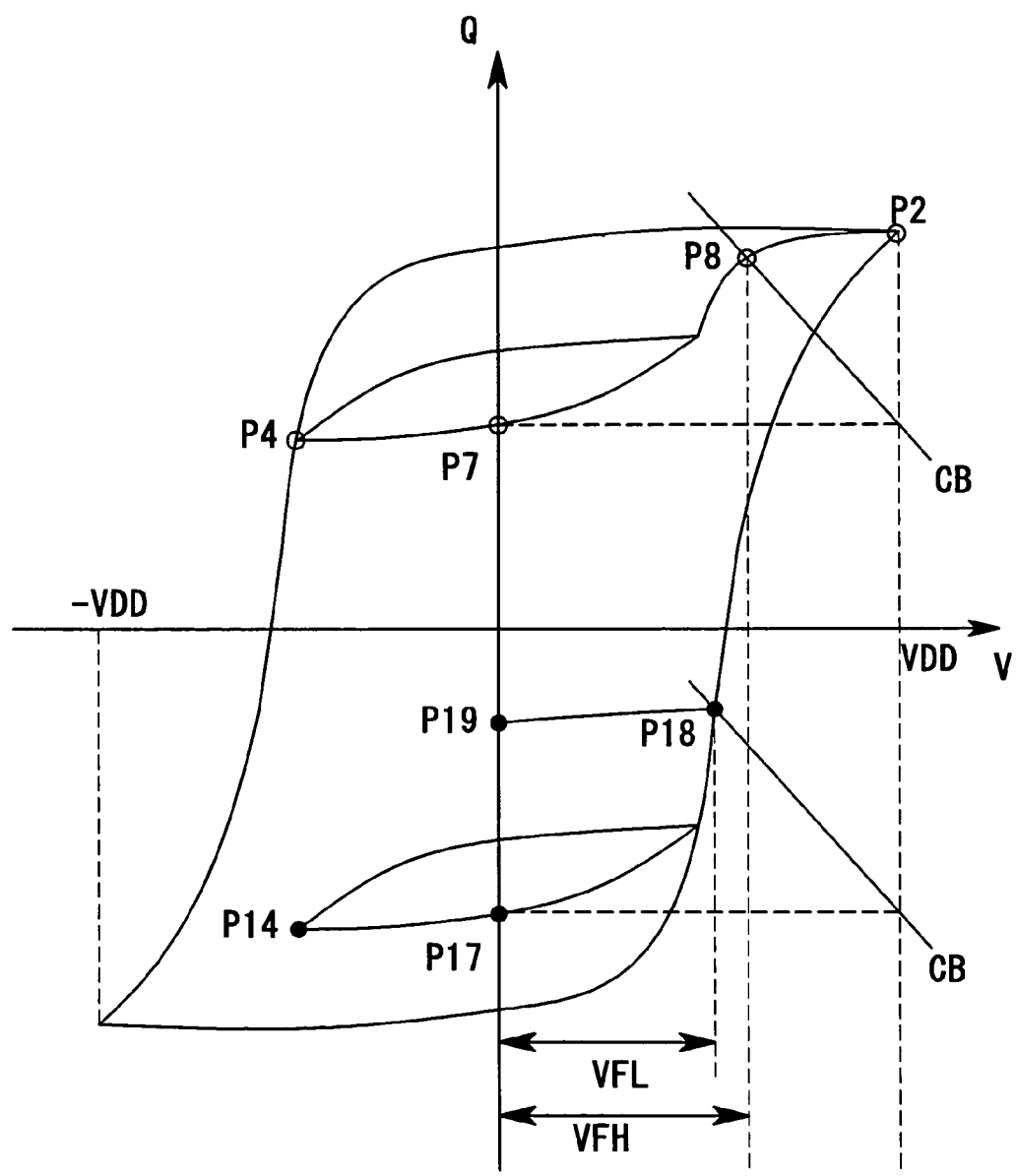
FIG. 8 is a graph used to explain the polarization state of a ferroelectric capacitor FC during the operation of the functional memory 1.

Description will be made of the data reading operation in the non-volatile mode FM with reference to FIG. 2, FIG. 4 and FIG. 8. FIG. 8 is a graph used to explain the polarization state of the ferroelectric capacitor FC in this operation. FIG. 4 is a view, illustrating the state of the circuit of the functional memory 1 at the moment denoted as (2) in FIG. 2 during the operation.

As shown in FIG. 2 and FIG. 4, in the non-volatile mode FM, the voltage of the plate line PL1 is once lowered to the ground voltage GND. Here, an ON signal (source voltage VDD) is given to the select line SL1 and an ON signal (source voltage VDD) is given to the plate line PL1. Then, an ON signal (source voltage VDD) is given to the control terminal of the sense amplifier SA.

By the above sequential procedure, the voltage of the data line DL1 becomes either the source voltage VDD or the ground voltage GND. This represents the non-volatile data "A" read out. As shown in FIG. 4, the exclusive OR circuit 7 obtains the exclusive OR of the non-volatile data "A" read out and the volatile data "B" held in the flip-flop circuit FF1 and outputs the operation result.

Then, an ON signal (source voltage VDD) is given to the clock line CL2. The operation result is thereby held in the flip-flop circuit FF2.

As shown in FIG. 8, the polarization state of the ferroelectric capacitor FC becomes either P2 or P19 by the above sequential procedure. Namely, when the polarization state of the ferroelectric capacitor FC has become P3 or P4 (see FIG. 7) by the data reading operation in the volatile mode DM described above, the polarization state of the ferroelectric capacitor FC becomes P2 via P4, P7 and P8 by this data reading operation in the non-volatile mode FM.

When the polarization state of the ferroelectric capacitor FC has become P13 or P14 (see FIG. 7) by the data reading operation in the volatile mode DM described above, the polarization state of the ferroelectric capacitor FC becomes P19 via P14, P17 and P18 by this data reading operation in the non-volatile mode FM.

In FIG. 8, VFH represents the voltage which the data line DL1 exhibits immediately before the sense amplifier SA shown in FIG. 2 is turned on when the non-volatile data "A" having been stored in the ferroelectric capacitor FC are "H", and VFL represents the voltage which the data line DL1 exhibits immediately before the sense amplifier SA is turned on when the volatile data "A" having been stored in the ferroelectric capacitor FC are "L".

After that, when the sense amplifier SA is turned on, the voltage of the data line DL1 becomes either the source voltage VDD or the ground voltage GND by an action of the sense amplifier SA depending on whether the latest voltage was VFH or VFL.

Figure 5:
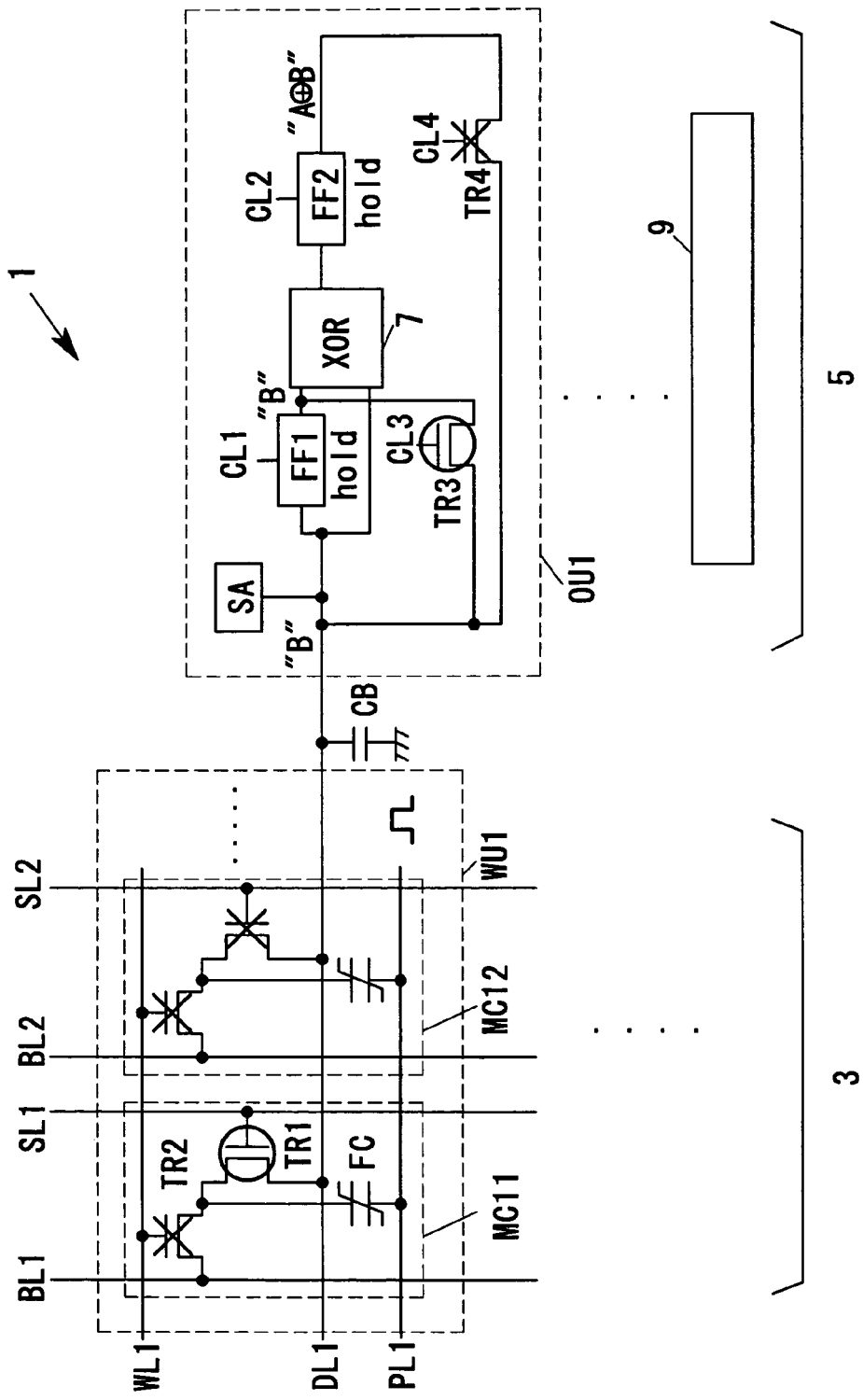
FIG. 5 is a circuit diagram used to explain the operation of the functional memory 1.
Figure 9:
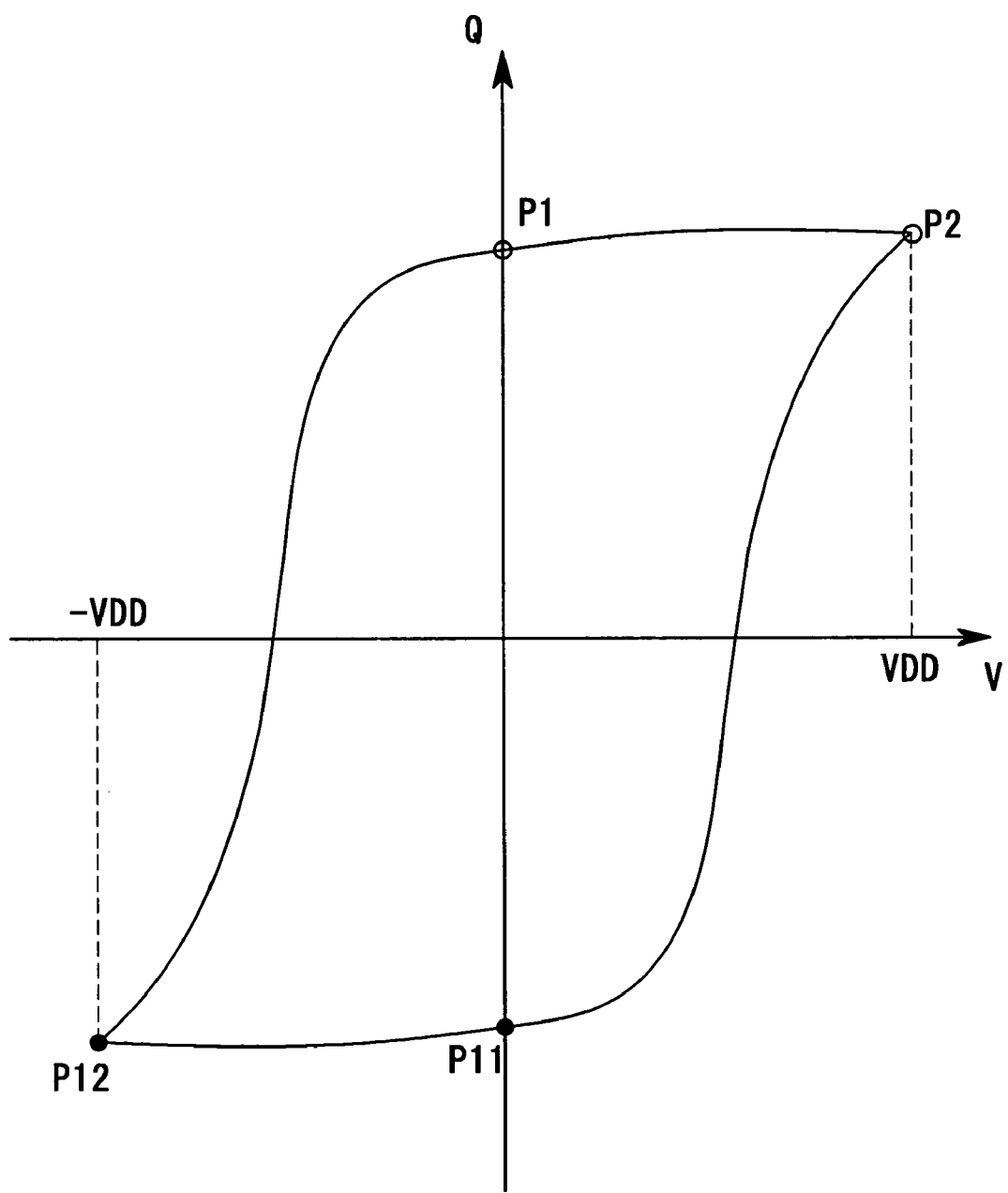
FIG. 9 is a graph used to explain the polarization state of a ferroelectric capacitor FC during the operation of the functional memory 1.

Description will be made of the data writing operation WO in the non-volatile mode FM with reference to FIG. 2, FIG. 5 and FIG. 9. FIG. 9 is a graph used to explain the polarization state of the ferroelectric capacitor FC in this operation. FIG. 5 is a view, illustrating the state of the circuit of the functional memory 1 at the moment denoted as (3) in FIG. 2 during the operation.

As shown in FIG. 2 and FIG. 5, in the non-volatile mode FM, the voltage of the plate line PL1 is once lowered to the ground voltage GND. Here, an ON signal (source voltage VDD) is given to the clock line CL3 to turn on the transistor TR3. The volatile data "B" held in the flip-flop circuit FF1 are thereby given to the data line DL1.

Then, an ON signal (source voltage VDD) is given to the select line SL1 and an ON signal (source voltage VDD) is given to the plate line PL1. By the procedure, the volatile data "B" having been given to the data line DL1 are written into the ferroelectric capacitor FC as new non-volatile data.

As shown in FIG. 9, the polarization state of the ferroelectric capacitor FC becomes either P2 or P11 by the above sequential procedure.

Namely, when the volatile data "B" given to the data line DL1 are "H", the polarization state of the ferroelectric capacitor FC becomes P2 via P1 by this data writing operation in the non-volatile mode FM. In this case, the polarization state returns to P1 with the lapse of time. When the volatile data "B" given to the data line DL1 are "L", the polarization state of the ferroelectric capacitor FC becomes P11 via P12 by this data writing operation in the non-volatile mode FM.

Thus, the polarization state P1 (or P2) in FIG. 9 corresponds to the non-volatile data "H" and the polarization state P11 in FIG. 9 corresponds to the non-volatile data "L".

Figure 6:
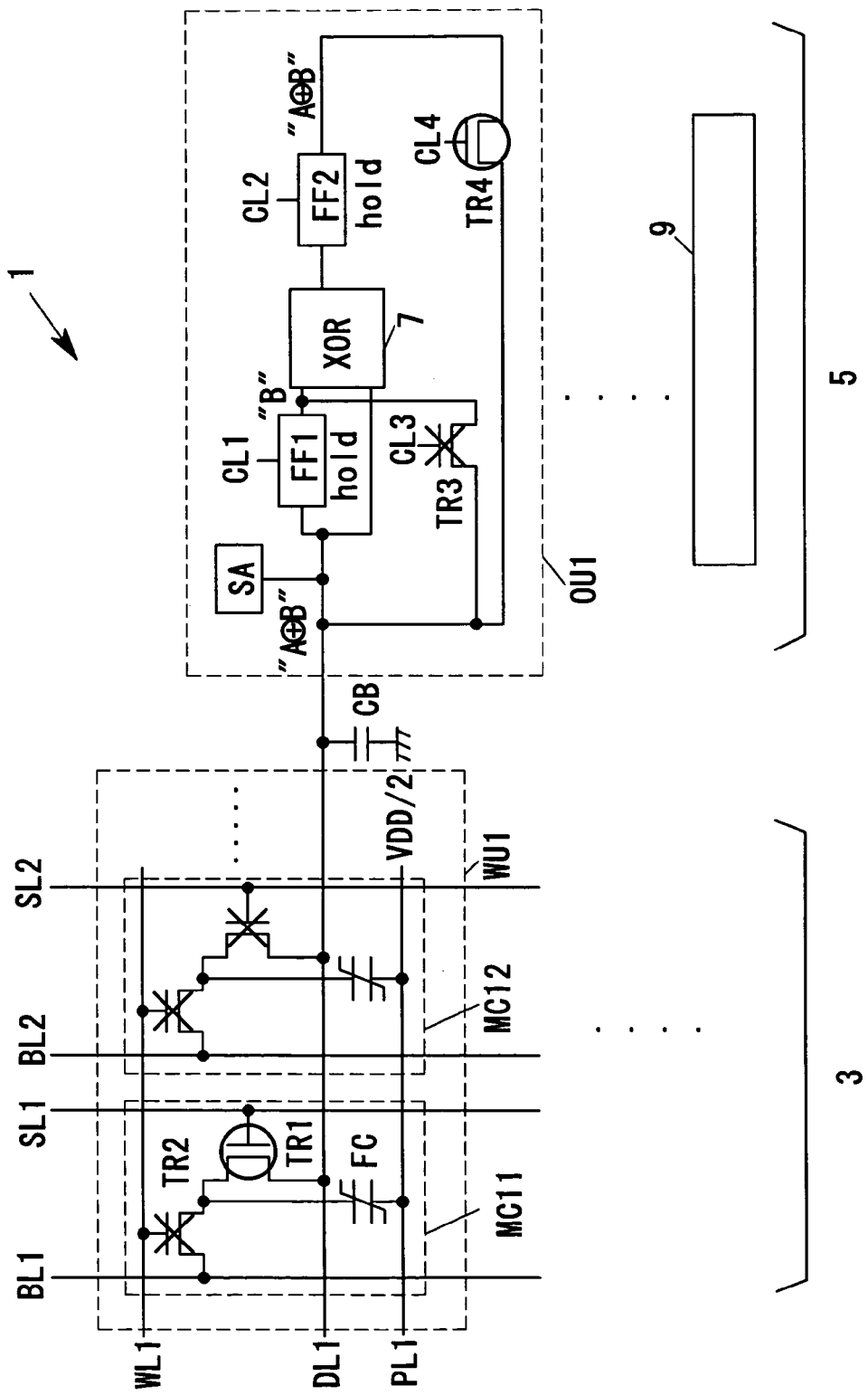
FIG. 6 is a circuit diagram used to explain the operation of the functional memory 1.
Figure 10:
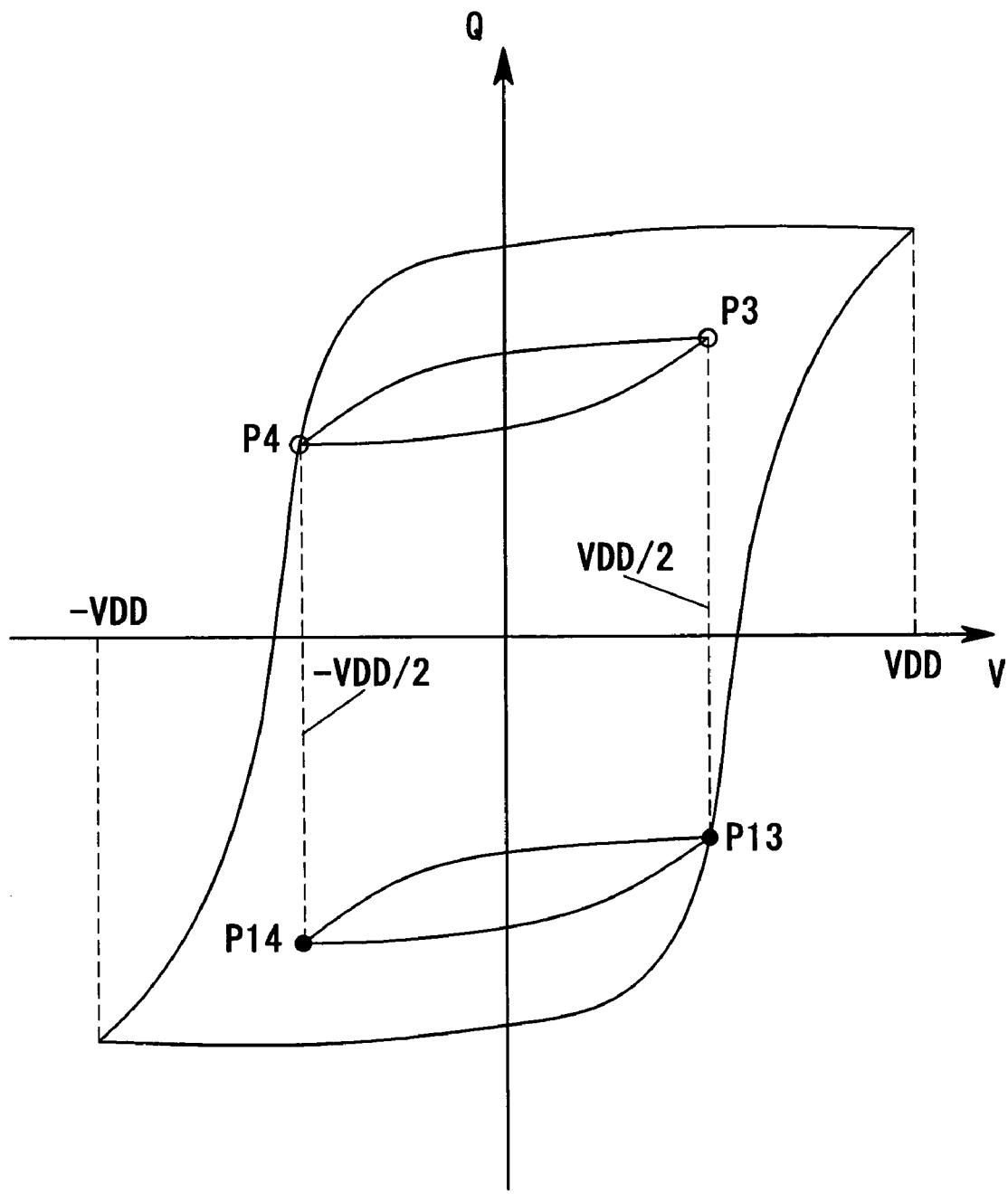
FIG. 10 is a graph used to explain the polarization state of a ferroelectric capacitor FC during the operation of the functional memory 1.

Description will be made of the data writing operation in the volatile mode DM with reference to FIG. 2, FIG. 6 and FIG. 10. FIG. 10 is a graph used to explain the polarization state of the ferroelectric capacitor FC in this operation. FIG. 6 is a view, illustrating the state of the circuit of the functional memory 1 at the moment denoted as (4) in FIG. 2 during the operation.

As shown in FIG. 2 and FIG. 6, in the volatile mode DM, the voltage of the plate line PL1 is maintained at VDD/2. Here, an ON signal (source voltage VDD) is given to the clock line CL4 to turn on the transistor TR4. The operation result having been held in the flip-flop circuit FF2, namely the exclusive OR of the data "A" and data "B" is thereby given to the data line DL1.

Then, an ON signal (source voltage VDD) is given to the select line SL1. By this procedure, the operation result having been given to the data line DL1 is written into the ferroelectric capacitor FC as new volatile data.

As shown in FIG. 10, the polarization state of the ferroelectric capacitor FC becomes one of P3, P4, P13 and P14 by the above sequential procedure. Namely, when the new non-volatile data written by the immediately preceding data writing operation in the non-volatile mode FM are "H", the polarization state of the ferroelectric capacitor FC becomes either P3 or P4 depending on whether the operation result given to the data line DL1 is "H" or "L".

When the new non-volatile data written by the immediately preceding data writing operation in the non-volatile mode FM, are "L", the polarization state of the ferroelectric capacitor FC becomes either P13 or P14 depending on whether the operation result given to the data line DL1 is "H" or "L".

When one cycle of reading and writing operations, namely data reading in the volatile mode DM, data reading in the non-volatile mode FM, data writing in the non-volatile mode FM, and data writing in the volatile mode, on the memory cell MC11 are completed, reading and writing operations on the next memory cell MC12 are stated.

The reading and writing operations are performed on the memory cells MC11, MC12, . . . of one word unit WU1 in sequence. As described before, the functional memory 1 has a plurality of operation units OU1, OU2, . . . corresponding to the word units WU1, . . . , respectively, and the operation units OU1, . . . perform operations in parallel. Thus, the functional memory 1 performs processing in bit-serial word-parallel fashion.

Figure 11:
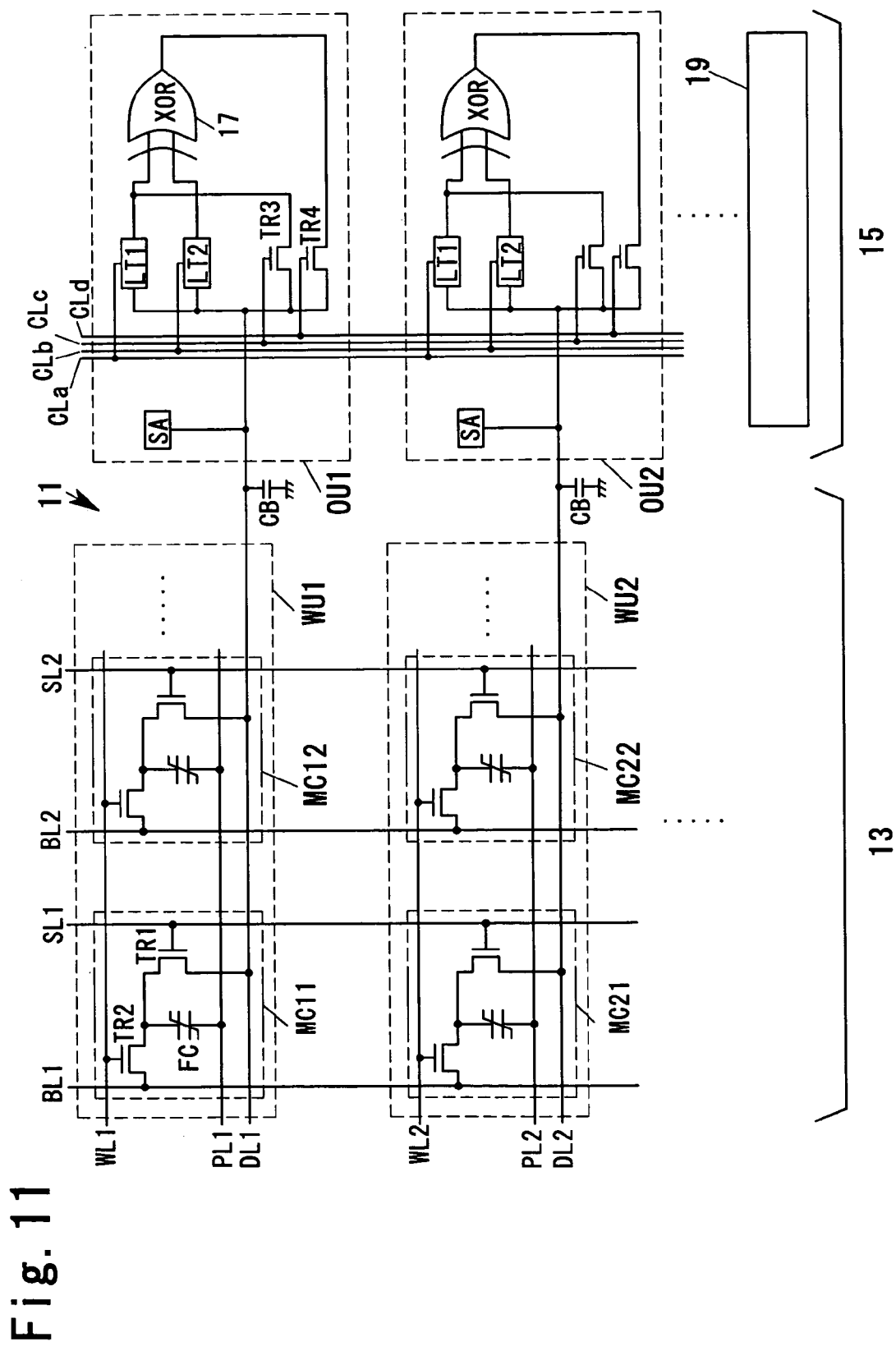
FIG. 11 is a view, illustrating the circuit structure of a functional memory 11 as a memory device with a function to perform an operation according to another embodiment of this invention.

FIG. 11 shows the circuitry of a functional memory 11 as a memory device with a function to perform an operation according to another embodiment of this invention. The functional memory 11 has a memory section 13 and an operation and storage control section 15.

The memory section 13 has the same constitution as the memory section 3 of the functional memory 1 shown in FIG. 1 and therefore its description is not recited again. The functional memory 11 has word lines WL1, WL2, . . . , data liens DL1, DL2, . . . , plate lines PL1, PL2, . . . , bit lines BL1, BL2, . . . , and select lines SL1, SL2, . . . as in the case with the functional memory 1.

The operation and storage control section 15 has a control unit 19 and a plurality of operation units OU1, OU2, . . . The control unit 19 and the operation units OU1, OU2, . . . correspond to the control unit 9 and the operation units OU1, OU2, . . . in the functional memory 1 but partly different from those in the functional memory 1.

With reference to FIG. 11, the operation and storage control section 15 of the functional memory 11 will be described. The operation units OU1, OU2, . . . shown in FIG. 11 correspond to word units WU1, WU2, . . . , respectively, of the memory section 13. Namely, the operation units OU1, OU2, . . . are connected to the word units WU1, WU2, . . . , respectively, of the memory section 13 via the data lines DL1, DL2, . . . , respectively. The parasitic capacity of the data lines DL1, . . . is used as a load capacity (load capacitor) CB.

The operation unit OU1 has a sense amplifier SA as a normalization circuit, an exclusive OR circuit 17 as an operation circuit, latch circuits LT1 and LT2 as first and second hold circuits, and transistors TR3 and TR4 as third and fourth switch means.

The sense amplifier SA is connected to the data line DL1 and normalizes a signal on the data line DL1. Namely, the sense amplifier SA judges whether the signal voltage on the data line DL1 is higher or lower than a specified threshold value and forcibly changes the voltage of the data line DL1 to the source voltage VDD of the ground voltage GND depending on the magnitude of the signal.

The data latch circuit LT1 holds volatile data (second data) as binary data read out from a memory cell of the word unit WU1 such as the memory cell MC11 via the data line DL1 according to the control of a clock line CLa.

The data latch circuit LT2 holds non-volatile data (first data) as binary data read out from the memory cell MC11 of the word unit WU11 via the data line DL1 according to the control of a clock line CLb.

The exclusive OR circuit 17 obtains and outputs the excusive OR of the volatile data held in the data latch circuit LT1 and the non-volatile data held in the data latch circuit LT2.

The transistor TR3 transmits the volatile data held in the data latch circuit LT1 to the data line DL1 according to the control of a clock line CLc. As described later, the volatile data are written into the memory cell MC11 as new non-volatile data.

The transistor TR4 transmits the operation result outputted from the exclusive OR circuit 17 to the data line DL1 according to the control of a clock line CLd. As described later, the operation result is written into the memory cell MC11 as new volatile data.

The other operation units OU2, . . . are also constituted in the same manner as the operation unit OU1.

The control unit 19 controls reading and writing data from and into the memory section 13, the operations in the operation units OU1, . . . , and so on. More specifically, the control unit 19 controls the control lines such as the word lines WL1, the plate lines PL1, . . . , the data lines DL1, DL2, . . . , the bit lines BL1, BL2, . . . , the select lines SL1, . . . , the control line of the sense amplifier SA, and the clock lines CLa, CLb, CLc and CLd.

Figure 12:
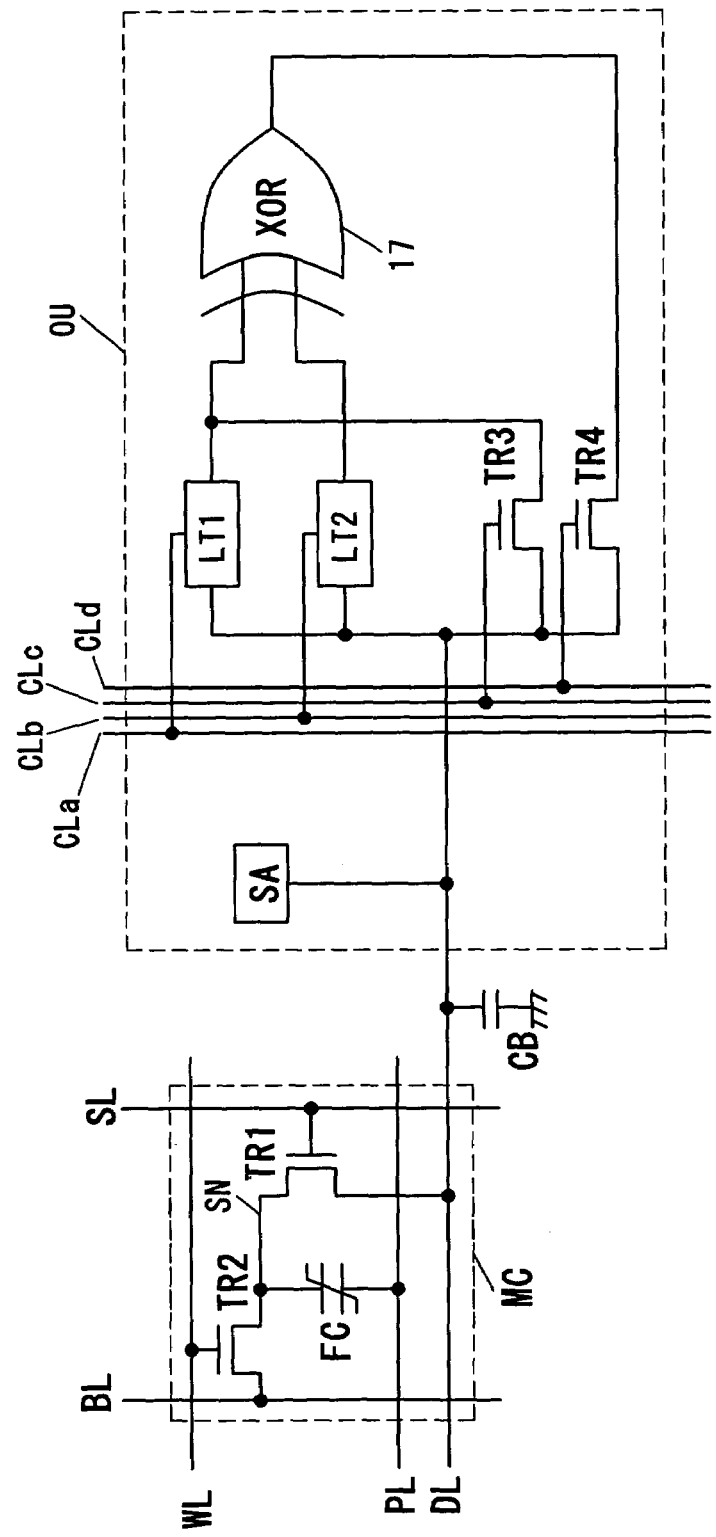
FIG. 12 is an enlarged view, showing part of the circuit of the functional memory 11 for explaining the operation thereof.
Figure 13:
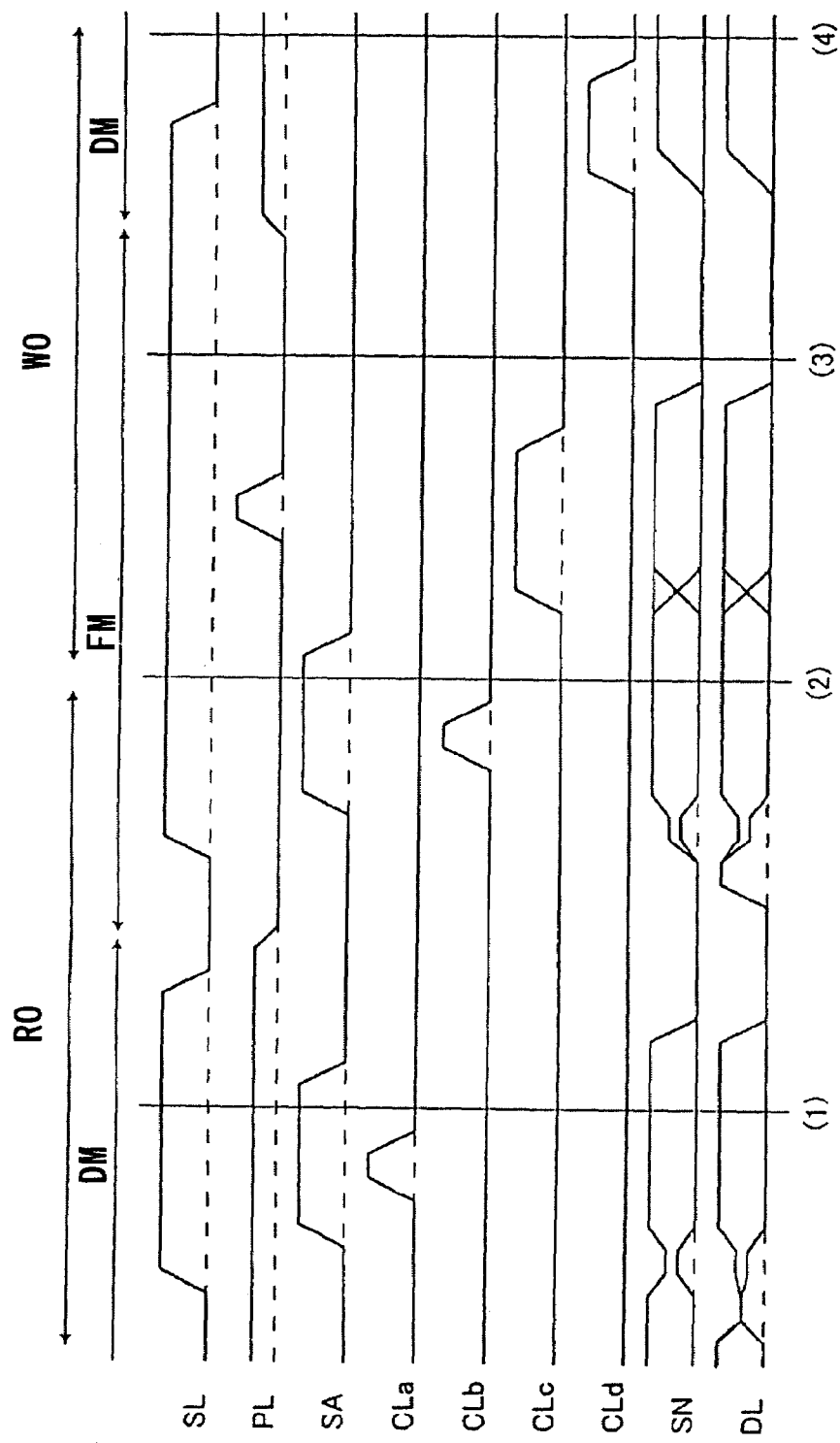
FIG. 13 is an example of a timing diagram, showing the operation of the functional memory 11.

FIG. 13 is an example of a timing diagram, illustrating the operation of the functional memory 11 performed under the control of the control unit 19. FIG. 12 is an enlarged partial view of the circuit of the functional memory 11 for explaining the operation of the functional memory 11. For convenience of explanation, some of the numerals and symbols are simplified. The operation of the functional memory 11 will be described based on FIG. 12 and FIG. 13 and with reference to FIG. 7 to FIG. 10 if necessary.

In the functional memory 11, a data reading operation RO and a data writing operation WO are alternatively performed as shown in FIG. 13. In the reading operation RO, data are read out in a volatile mode DM and then in a non-volatile mode FM.

In the writing operation WO, data are written in a non-volatile mode FM and then in a volatile mode DM.

Description will be made of the data reading operation in the volatile mode DM. As shown in FIG. 13, in the volatile mode DM, the voltage of the plate line PL is kept at half of the source voltage VDD, namely VDD/2. Here, VDD/2 is given to the data line DL and then an ON signal (source voltage VDD) is given to the select line SL. Then, an ON signal (source voltage VDD) is given to a control terminal of the sense amplifier SA.

By the above sequential procedure, the voltage of the data line DL becomes either the source voltage VDD (5 volts, for example) or the ground voltage GND (zero volt). This represents the volatile data read out. The volatile data are represented as "B" ("H" or "L"). The "H" and "L" correspond to the source voltage VDD and the ground voltage GND, respectively.

Then, an ON signal (source voltage VDD) is given to the clock line CLa. The volatile data "B" having been read into the data line DL are thereby held in the data latch circuit LT1 shown in FIG. 12. In FIG. 13, SN shows the change in the voltage of a memory node SN in the memory cell MC shown in FIG. 12.

When the non-volatile data having been written in the ferroelectric capacitor FC are represented as "A", the polarization state of the ferroelectric capacitor FC at the moment denoted as (1) in FIG. 13 is one of P3, P4, P13 and P14 shown in FIG. 7 depending on the combination of the content of the volatile data "B" which were stored in the ferroelectric capacitor FC and the content of the non-volatile data "A".

The non-volatile data "A" are not destroyed by the reading operation in the volatile mode DM as in the case with the functional memory 1.

Description will be made of the data reading operation in the non-volatile mode FM. As shown in FIG. 13, the voltage of the plate line PL is fixed at the ground voltage GND during the data reading operation in the non-volatile mode FM.

Here, the source voltage VDD is given to the data line DL, and subsequently an ON signal (source voltage VDD) is given to the select line SL. Then, an ON signal (source voltage VDD) is given to the control terminal of the sense amplifier SA.

By the above sequential procedure, the voltage of the data line DL becomes either the source voltage VDD or the ground voltage GND, which represents the non-volatile data "A" read out. Then, an ON signal (source voltage VDD) is given to the clock line CLb. The non-volatile data "A" read out are thereby held in the data latch circuit LT2 shown in FIG. 12. As shown in FIG. 12, the exclusive OR circuit 17 obtains the exclusive OR of the non-volatile data "A" held in the data latch circuit LT2 and the volatile data "B" held in the data latch circuit LT1 and outputs the operation result.

The polarization state of the ferroelectric capacitor FC at the moment denoted as (2) in FIG. 13 is either P2 or P19 shown in FIG. 8 depending on the content of the non-volatile data "A" which were stored in the ferroelectric capacitor FC.

In the functional memory 11, a pulse for read out (source voltage VDD) is given not to the plate line PL but to the data line DL in the data reading operation in the non-volatile mode FM. This is because a data line DL has a smaller driving electrostatic capacity in general than a plate line PL and the driving speed can be easily increased.

Description will be made of the data writing operation WO in the non-volatile mode FM. As shown in FIG. 13, in the initial stage of the non-volatile mode FM, the voltage of the plate line PL is remained at the ground voltage GND. Here, an ON signal (source potential VDD) is given to the clock line CLc to turn on the transistor TR3 shown in FIG. 12. The volatile data "B" having been held in the data latch circuit LT1 are thereby given to the data line DL.

After that, an ON signal (source voltage VDD) is given to the plate line PL. The volatile data "B" given to the data line DL are thereby written into the ferroelectric capacitor FC as new non-volatile data.

The polarization state of the ferroelectric capacitor FC at the moment denoted as (3) in FIG. 13 becomes either P1 or P11 shown in FIG. 9 depending on the content of the newly written non-volatile data (the volatile data "B" given to the data line DL).

Description will be made of the data writing operation in the volatile mode DM. As shown FIG. 13, in the volatile mode DM, the voltage of the plate line PL is kept at VDD/2. Here, an ON signal (source voltage VDD) is given to the clock line CLd to turn on the transistor TR4 shown in FIG. 12.

The operation result outputted from the exclusive OR circuit 17, namely the exclusive OR of the data "A" and data "B" is given to the data line DL. The operation result is thereby written into the ferroelectric capacitor FC as new volatile data.

The polarization state of the ferroelectric capacitor FC at the moment denoted as (4) in FIG. 13 becomes one of P3, P4, P13 and P14 shown in FIG. 10 depending on the combination of the contents of the non-volatile data newly written by the preceding data writing operation in the non-volatile mode FM (data "B" in this embodiment) and the volatile data newly written by the immediately preceding data writing operation in the volatile mode DM (the exclusive OR of the data "A" and data "B" in this embodiment).

As described above, one cycle of reading and writing operations, namely data reading in the volatile mode DM, data reading in the non-volatile mode FM, data writing in the non-volatile mode FM, and data writing in the volatile mode DM, on the memory cell MC are performed. The functional memory 11 performs an operation in bit-serial word-parallel fashion by repeating the above operations as in the case with the functional memory 1.

Figure 14:
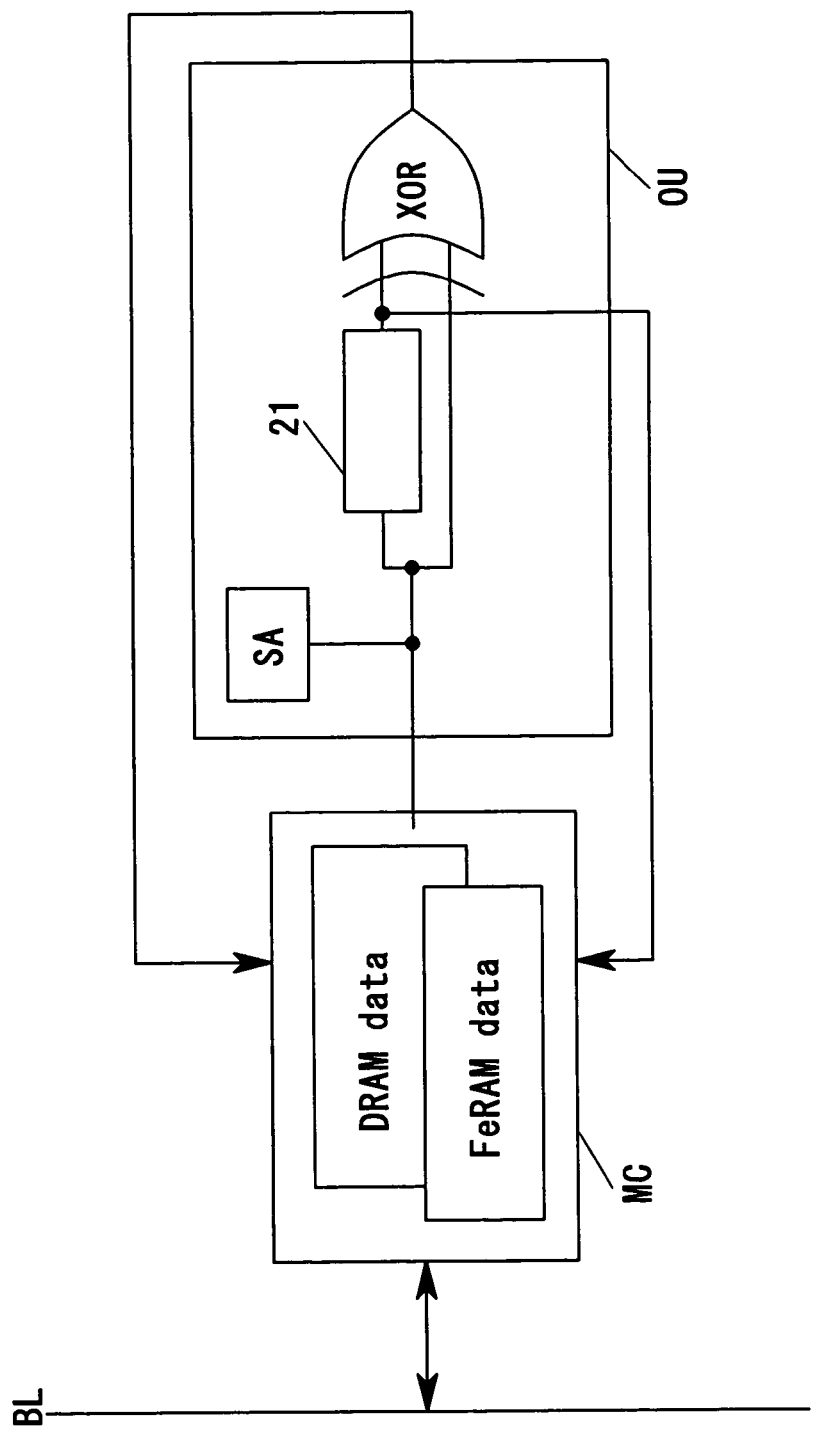
FIG. 14 is a view used to conceptually explain the functional memories 1 and 11.

FIG. 14 is a view for conceptually explaining the functional memory 1 or the functional memory 11 in the above embodiments. In the above embodiments, a functional memory has a memory cell MC and an operation unit OU. The memory cell MC can store two independent data sets; DRAM data (volatile data) and FeRAM data (non-volatile data). The operation unit OU has a sense amplifier SA, at least one hold circuit 21, and an operation circuit (an exclusive OR circuit in this example).

First, the DRAM data are read out from the memory cell MC and temporarily held in the hold circuit 21. Then, the FeRAM data are read out from the memory cell MC. The DRAM data held in the hold circuit 21 are written in the memory cell MC as new FeRAM data. After that, the exclusive OR of the FeRAM data having been read out and the DRAM data held in the hold circuit 21 is written in the memory cell MC as new DRAM data.

In a functional memory constituted as described above, two independent data sets can be stored in one memory cell, the number of memory cells can be reduced to a half.

Also, the DRAM data read out are written in the memory cell in a non-volatile manner as new FeRAM data. For example, if data "A", "B", "C", "D" are read out in this order with an operation is performed on each combination of the data "A" and "B", "B" and "C", "C" and "D", . . . , in sequence, the DRAM data B to be used in the next operation on the FeRAM data A and the DRAM data B which have been read out for the previous operation are stored in the memory cell in a non-volatile manner for preparation of the next operation.

Thus, even when the power source is shut down by an unexpected trouble, the data "B" necessary for the next operation are not lost. Therefore, when the power source is recovered, the processing can be resumed with the next operation without reading out the data "B" again.

It is, therefore, possible to realize a functional memory having saved space and cost and capable of start, immediately after the power source is recovered, the processing which was being performed at the time of power failure.

Also, in the functional memory constituted as illustrated in FIG. 14, the operation result (exclusive OR) can be stored using the memory area (conceptual area) for the DRAM data which has become unnecessary after performing an operation. Thus, when memory cells corresponding in number to bit number are prepared to perform operations in sequence in a bit-serial fashion, and the operation results are stored in sequence so that they can be taken out together later, there is no need for preparing memories for storing the operation results corresponding in number to the bit number. Namely, the space and cost can be further saved.

Although the functional memory is used in processing image data in the above embodiments, this invention is not limited thereto. The functional memory is applicable to processing of various types of data including vocal data in addition to image data.

Although an exclusive OR circuit is used as the operation circuit in the above embodiment, this invention is not limited thereto. As the operation circuit, any type of a logical circuit other than an exclusive OR circuit or any type of an arithmetic circuit such as an adding circuit may be used. A complex circuit in which a variety of operation elements are combined may be also used.

Although flip-flop circuits or data latch circuits are used as the first and second hold circuits in the above embodiment, this invention is not limited thereto. As or in place of the first and/or second hold circuits, capacitors or delay circuits may be used so that data can be substantially held. These may be used in combination.

Although operation and storage processes are performed in a bit-serial word-parallel fashion in the above embodiments, this invention is not limited thereto. For example, all the data may be processed simultaneously or one by one.

Although the result of an operation on the first and second data is written in the memory cell as new second data in the above embodiments, this invention is not limited thereto. For example, new data may be written into the memory cell in volatile manner instead of writing back the result of operation on the first and second data into the memory cell. In this case, the operation result is outputted without being held in the memory cell. In a functional memory constituted as described above, when memory cells for one word are prepared to process data in a bit-serial word-parallel fashion, the data can be processed in sequence without latency time.

Although one memory cell has one ferroelectric capacitor and two transistors in the above embodiments, this invention is not limited thereto. For example, one memory cell may have two or more ferroelectric capacitors and one or three or more transistors.

Although the memory cell is constituted of a ferroelectric capacitor in the above embodiments, this invention is not limited thereto. The memory cell may be constituted of a memory element other than a ferroelectric capacitor such as a TMR (tunnel magnetoresistance) element. As a memory element for a memory cell, a non-volatile memory element with hysteresis characteristics can be used in general.

The drawings appended to this application such as circuit diagrams and timing diagrams are used to illustrate the embodiments of this invention and not intended to limit this invention.

The memory device with a function to perform an operation according to this invention has a memory section having a memory cell, and an operation and storage control section. The memory cell stores first data in a non-volatile manner and second data in volatile manner. The operation and storage control section makes controls to read out the first and second data stored in the memory cell and perform an operation on the first and second data, and to write the read-out second data into the memory cell in a non-volatile manner as new first data.

The method of performing an operation and storage according to this invention is a method for performing an operation on data and storing data using a memory section having a memory cell. The memory cell stores first data in a non-volatile manner and second data in a volatile manner. The operation and storage method comprises a step of reading out first and second data stored in the memory cell and performing an operation on the first and second data, and a step of writing the read-out second data in the memory cell in a non-volatile manner as new first data.

According to the memory device with a function to perform a operation or the method of performing an operation and storage of this invention, since two independent data sets can be stored in one memory cell, the number of memory cells can be reduced to a half.

The second data read out are written in the memory cell in a non-volatile manner as new first data. For example, data "A", "B", "C", "D" are read out in this order and an operation is performed on each combination of the data "A" and "B", "B" and "C", "C" and "D", . . . , in sequence, the second data "B" to be used in the next operation of the first data "A" and the second data "B" which have been read out for the previous operation are stored in the memory cell in a non-volatile manner for the preparation of the next operation. Thus, even when the power source is shut down by an unexpected trouble, the data "B" necessary for the next operation are not lost. Therefore, when the power source is recovered, the processing can be resumed with the next operation without reading out the data "B" again.

It is, therefore, possible to realize a memory device with a function to perform an operation and a method of performing an operation and storage which can save space and cost and which can start, immediately after the power source is recovered, the processing which was being performed at the time of power failure.

The memory device with a function to perform an operation according to this invention is characterized in that the operation and storage control section makes a control to write the result of the operation on the first and second data in the memory cell in a volatile manner as new second data.

The method of operation and storage according to this invention is characterized by having a step of writing the operation result into the memory cell in a volatile manner as new second data.

Thus, according to the memory device with a function to perform an operation or the method of operation and storage according to this invention, the operation result can be stored using a volatile memory area which has become unnecessary after performing an operation. Thus, when memory cells corresponding in number to bit number are prepared to perform operations in sequence in a bit-serial fashion, and the operation results are stored in sequence so that they can be taken out together later, there is no need for preparing memories for storing the operation results corresponding in number to the bit number. Namely, the space and cost can be further saved.

The memory device with a function to perform an operation according to this invention is characterized in that the operation and storage control section makes controls to read out the second and first data from the memory cell in this order and write new first and second data in the memory cell in this order.

Since the second data, which are volatile and have a high possibility of being destroyed when the first data, which are non-volatile, are read out are read out before the first data are read out, and the second data, which have a high possibility of being destroyed when the first data are written, are written after the first data have been written, two independent data sets can be written into and read from one memory cell without destroying either of them.

In the memory device with a function to perform an operation according to this invention, the memory section has one or more word units comprising a plurality of memory cells. The operation and storage control section has operation units corresponding to, and in the same number of, the word units. The operation and storage control section controls each of the operation units to perform an operation on a plurality of memory cells of its corresponding word unit one by one. Thus, it is possible to realize a bit-serial word-parallel operation, which is used in image processing or the like. In this case, since one operation unit is sufficient for each word, the space and the cost can be further saved.

In the memory device with a function to perform an operation according to this invention, each of the operation units has a first hold circuit, an operation circuit, and a second hold circuit. The first hold circuit temporarily holds second data read out from a memory cell being processed.

The operation circuit performs an operation on the first and second data read out from the memory cell. The second hold circuit temporarily holds the first data read out from the memory cell or a result of the operation performed by the operation circuit. The operation and storage control section makes a control to write the second data held in the first hold circuit in the memory cell in a non-volatile manner as new first data.

Thus, the second data which have been read out before the first data are read out can be held in the first hold circuit while the first data are being read out. Therefore, the second data can be written back into the memory cell as new first data after the first data have been read out.

Also, the first data which have been read out before the second data are written back into the memory cell as new first data or the result of the operation performed by the operation circuit can be held in the second hold circuit while the second data are written back into the memory cell as new first data. Therefore, the operation result can be written back into the memory cell as new second data after the second data have been written back into the memory cell as new first data.

In the memory device with a function to perform an operation according to this invention, the memory cell comprises a ferroelectric capacitor. The memory cell stores first data in a non-volatile manner according to a change in the polarization direction of the ferroelectric capacitor and stores second data in a volatile manner according to a change in the polarization state of the ferroelectric capacitor which cause no polarization reversal thereof.

Since the memory cell comprises a ferroelectric capacitor, writing can be done at a high speed with a low voltage. When the coercive voltage of the ferroelectric capacitor is set to a value higher than a half of the source voltage, the maximum absolute value of the voltage applied to the ferroelectric capacitor in reading and writing the non-volatile first data can be made equal to the source voltage and the maximum absolute value of the voltage applied to the ferroelectric capacitor in reading and writing the volatile second data can be a half of the source voltage. Thus, the circuit structure can be simplified.

While this invention has been described in its preferred embodiments, it is understood that the terminology employed herein is for the purpose of description and not of limitation and that changes and variations may be made without departing from the spirit and scope of the appended claims.

What is claimed is:

1. A memory device with a function to perform an operation comprising:
   a memory section having a memory cell for storing first data in a non-volatile manner and second data in a volatile manner; and
   an operation and storage control section for making controls to read out said first and second data stored in said memory cell and perform an operation on said first and second data, and to write said read-out second data into said memory cell in a non-volatile manner as new first data.

2. The memory device with a function to perform an operation as set forth in claim 1, wherein said operation and storage control section makes a control to write the result of said operation on said first and second data into said memory cell in a volatile manner as new second data.

3. The memory device with a function to perform an operation as set forth in claim 1, wherein said operation and storage control section makes controls to read out said second and first data from said memory cell in this order and write new first and second data into said memory cell in this order.

4. The memory device with a function to perform an operation as set forth in claim 1, wherein said memory section has one or more word units each comprising a plurality of memory cells, and said operation and storage control section has operation units corresponding to, and in the same number of, said word units, wherein said operation and storage control section controls each of said operation units to perform an operation on a plurality of memory cells of its corresponding word unit one by one.

5. The memory device with a function to perform an operation as forth in claim 4, wherein each of said operation units comprises:

a first hold circuit for temporarily holding said second data read out from a memory cell being processed;

an operation circuit for performing an operation on said first and second data read out from said memory cell; and a second hold circuit for temporarily holding said first data read out from said memory cell or a result of said operation of said operation circuit, wherein said operation and storage control section makes a control to write said second data held in said first hold circuit into said memory cell in a non-volatile manner as new first data.

6. The memory device with a function to perform an operation as set forth in claim 1, wherein said memory cell comprises a ferroelectric capacitor and stores first data in a non-volatile manner according to a change in the polarization direction of said ferroelectric capacitor and second data in a volatile manner according to a change in the polarization state of said ferroelectric capacitor with no polarization reversal thereof.

7. The memory device with a function to perform an operation as set forth in claim 6, wherein said ferroelectric capacitor has a coercive voltage which is higher than a half of the source voltage of said memory device with a function to perform an operation and is lower than said source voltage.

8. The memory device with a function to perform an operation as set forth in claim 2, wherein said operation and storage control section makes controls to read out said second and first data from said memory cell in this order and write new first and second data into said memory cell in this order.

9. The memory device with a function to perform an operation as set forth in claim 2, wherein said memory section has one or more word units each comprising a plurality of memory cells, and said operation and storage control section has operation units corresponding to, and in the same number of, said word units, wherein said operation and storage control section controls each of said operation units to perform an operation on a plurality of memory cells of its corresponding word unit one by one.

10. The memory device with a function to perform an operation as forth in claim 9, wherein each of said operation units comprises:

a first hold circuit for temporarily holding said second data read out from a memory cell being processed;

an operation circuit for performing an operation on said first and second data read out from said memory cell; and a second hold circuit for temporarily holding said first data read out from said memory cell or a result of said operation of said operation circuit, wherein said operation and storage control section makes a control to write said second data held in said first hold circuit into said memory cell in a non-volatile manner as new first data.

11. The memory device with a function to perform an operation as set forth in claim 2, wherein said memory cell comprises a ferroelectric capacitor and stores first data in a non-volatile manner according to a change in the polarization direction of said ferroelectric capacitor and second data in a volatile manner according to a change in the polarization state of said ferroelectric capacitor with no polarization reversal thereof.

12. The memory device with a function to perform an operation as set forth in claim 11, wherein said ferroelectric capacitor has a coercive voltage which is higher than a half of the source voltage of said memory device with a function to perform an operation and is lower than said source voltage.

13. The memory device with a function to perform an operation as set forth in claim 3, wherein said memory section has one or more word units each comprising a plurality of memory cells, and said operation and storage control section has operation units corresponding to, and in the same number of, said word units, wherein said operation and storage control section controls each of said operation units to perform an operation on a plurality of memory cells of its corresponding word unit one by one.

14. The memory device with a function to perform an operation as forth in claim 13, wherein each of said operation units comprises:

a first hold circuit for temporarily holding said second data read out from a memory cell being processed;

an operation circuit for performing an operation on said first and second data read out from said memory cell; and a second hold circuit for temporarily holding said first data read out from said memory cell or a result of said operation of said operation circuit, wherein said operation and storage control section makes a control to write said second data held in said first hold circuit into said memory cell in a non-volatile manner as new first data.

15. The memory device with a function to perform an operation as set forth in claim 3, wherein said memory cell comprises a ferroelectric capacitor and stores first data in a non-volatile manner according to a change in the polarization direction of said ferroelectric capacitor and second data in a volatile manner according to a change in the polarization state of said ferroelectric capacitor with no polarization reversal thereof.

16. The memory device with a function to perform an operation as set forth in claim 15, wherein said ferroelectric capacitor has a coercive voltage which is higher than a half of the source voltage of said memory device with a function to perform an operation and is lower than said source voltage.

17. The memory device with a function to perform an operation as set forth in claim 4, wherein said memory cell comprises a ferroelectric capacitor and stores first data in a non-volatile manner according to a change in the polarization direction of said ferroelectric capacitor and second data in a volatile manner according to a change in the polarization state of said ferroelectric capacitor with no polarization reversal thereof.

18. The memory device with a function to perform an operation as set forth in claim 5, wherein said memory cell comprises a ferroelectric capacitor and stores first data in a non-volatile manner according to a change in the polarization direction of said ferroelectric capacitor and second data in a volatile manner according to a change in the polarization state of said ferroelectric capacitor with no polarization reversal thereof.

19. A method of performing an operation on data and storing data using a memory section having a memory cell for storing first data in a non-volatile manner and second data in a volatile manner, comprising:

a step of reading out first and second data stored in said memory cell and performing an operation on said first and second data; and a step of writing said read-out second data into said memory cell in a non-volatile manner as new first data.

20. The method of performing an operation and storage as set forth in claim 19, further comprising the step of writing the result of said operation into said memory cell in a volatile manner as new second data.

* * * * *